United States Patent [19]
White et al.

[11] Patent Number: 6,090,248
[45] Date of Patent: *Jul. 18, 2000

[54] APPARATUS FOR COATING SUBSTRATES

[75] Inventors: Norman Henry White; Allen Robert Waugh; Alaric Graham Spencer; John Michael Walls, all of Whitwick, United Kingdom

[73] Assignee: Applied Vision Limited, United Kingdom

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/553,444

[22] PCT Filed: Mar. 17, 1995

[86] PCT No.: PCT/GB95/00580
§ 371 Date: Apr. 19, 1996
§ 102(e) Date: Apr. 19, 1996

[87] PCT Pub. No.: WO95/25827
PCT Pub. Date: Sep. 28, 1995

[30] Foreign Application Priority Data

Mar. 19, 1994 [GB] United Kingdom .................. 9405442

[51] Int. Cl.$^7$ .................................................. C23C 14/35
[52] U.S. Cl. ............................. 204/298.26; 204/192.12; 204/298.15; 204/298.19; 204/298.23; 204/298.25; 204/298.27; 204/298.28
[58] Field of Search ........................... 204/192.1, 192.12, 204/192.15, 192.23, 298.07, 298.15, 298.19, 298.23, 298.25, 298.26, 298.27, 298.28, 298.29; 118/719; 414/217, 222

[56] References Cited

U.S. PATENT DOCUMENTS 3,641,973  2/1972  Shrader ..................................... 118/49
4,851,095  7/1989  Scobey et al. .

FOREIGN PATENT DOCUMENTS

| 0 335 267 | 10/1989 | European Pat. Off. ........ C23C 14/56 |
| 0335267 | 10/1989 | European Pat. Off. . |
| 501 063 | 2/1971 | Switzerland ................... C23C 13/08 |
| 2 160 898 | 1/1986 | United Kingdom ............ C23C 14/34 |
| 2160898 | 1/1986 | United Kingdom . |
| 13114 | 8/1992 | WIPO . |

OTHER PUBLICATIONS

Connell et al., IBM Technical Disclosure Bulletin, vol. 6, No. 6, pp. 1–2, Nov. 1963.

Cilia et al., Proceedings of the INternational Colloquium on Plasma Processes, No. Colloque 9, Societe Francaise Du Vide, pp. 352–354, Jun. 1993.

Window et al., "Unbalanced de magnetrons as sources of high ion fluxes", J. Vac. Sci. Technol. A 4(3), pp. 453–456, Jun. 1986.

Nov. 6, 1963—New York IBM Technical Disclosure Bulletin, vol. 6, No. 6, pp. 1–2, Anonymous.

Jun. 6—Nov. 1993—Antibes Proceedings of the International Colloquium on Plasma Processes, No. Colloque 9, Societe Francaise Du Vide, pp. 352–354.

*Primary Examiner*—Rodney G. McDonald
*Attorney, Agent, or Firm*—Zarley, McKee, Thomte, Voorhees & Sease

[57] ABSTRACT

The invention relates to apparatus for depositing of materials onto at least one substrate mounted on a substrate carrier provided for rotation in a material depositing zone in a vacuum chamber and causing a reaction of the said material to form a coating having desired properties. In a first aspect of the invention there is provided a loading chamber in selective interconnection with the vacuum chamber whilst maintaining a vacuum therein and in a second aspect the carrier and/or the vacuum chamber walls are provided with linear protrusions to restrict the flow of reactive gases in the chamber and thereby reduce the occurrence of arcing and both aspects allowing the dimensions of the coating apparatus to be reduced in comparison to conventional coating apparatus.

19 Claims, 2 Drawing Sheets

APPARATUS FOR COATING SUBSTRATES

The invention of this application relates to apparatus for the coating of substrates such as, but not exclusively, optical lens. The coating process involves the deposition of material onto the substrates and reaction of the material to form a single or multilayered coating with required properties thereon.

There are many types of conventional deposition apparatus which provide means whereby a material can be deposited onto a substrate to provide a coating thereon. One application where the use of deposition apparatus is particulary effective is with respect to the provision of anti reflective coatings on optical lens. Apparatus for this form of coating is disclosed in the applicant's co-pending Application No WO 9213114.

In this apparatus the substrates are held on a disc in a vacuum chamber which is rotated relative to a number of magnetrons mounted in proximity to the disc for the deposition of sputtered material onto the substrates. Typically a multilayer coating is required to be provided and such a coating can be formed by the operation of magnetrons, one of which contains a target of, for example, silicon and the other contains a target of, for example, titanium. With the provision of a third, unbalanced, magnetron an oxygen plasma is created in the vacuum chamber in which the coating takes place and the desired multilayer coating of $SiO_2$ and $TiO_2$ can be achieved on a plurality of substrates.

As an alternative to mounting the substrates on a disc for rotation it is disclosed in Patent Application No EP 0328257 that the substrates can be mounted on the sides of a drum such that the drum is rotatable and the magnetrons which are provided to sputter material onto the substrates are provided adjacent to the drum and lie in the vertical axis on the walls of the chamber in which the substrate carrier rotates.

This form of apparatus is an adaptation and development of the earlier disclosure by Schiller and Hartsough U.S. Pat. No. 4,420,385. The European patent application discloses the provision of deposition and reaction in long narrow axial zones with respect to the substrate drum and thereby the reaction is effected by an ion source in a highly reactive longitudinal zone and physically separating this zone from the material deposition zones by means of a region of relatively low pressure. The use of selective shuttering of the deposition material magnetrons is also disclosed whereby when a magnetron is not in use the same is covered by a shutter to prevent the occurrence of any reaction with the target.

Due to the requirement to physically separate the deposition and reaction zones in this machine it is necessary for the drum on which the substrates are mounted to be relatively large so that the necessary physical distance between the reaction and deposition zones can be achieved. It is also necessary to use relatively large vacuum producing means and these features cause the apparatus to be relatively bulky.

There is a perceived requirement in the coatings trade for a machine which can be used to coat a plurality of substrates, but not in high volumes. The physical dimensions of the prior art machines do not allow them to be economical for relatively low volume coating of substrates but due to the physical constraints discussed the demand cannot be met using the apparatus which is currently available.

Furthermore both of the above conventional machines utilise DC power supplies to activate and drive the magnetrons and reaction means. The use of DC power can lead to arcing caused by the partial oxidation of the target and hence the physical separation between the magnetrons and reaction areas is required to be sufficient to prevent the occurrence of arcing. This again adds to the physical size requirements of the apparatus.

A further problem with conventional machines is the loading of substrates into the apparatus without causing damage to the magnetrons and/or ion sources in the coating chamber by exposure to air. The coating chamber is maintained in a vacuum condition to prevent damage and in order to prevent damage it is necessary to introduce the substrates into the vacuum chamber in a manner which maintains the vacuum. Co-pending application no WO9213114 discloses a method whereby a magazine of substrates is loaded into the vacuum chamber whilst maintaining the same in vacuum and each of the substrates is moved by automated means from the magazine to a holding position on a carrier which is permanently mounted in the vacuum chamber. Whilst this method is known to be succesful the process is somewhat slow and causes a considerable amount of downtime in that the apparatus cannot be used for coating until loading and/or unloading of the substrates is completed.

A first aim of the invention is to provide a machine for the deposition of material onto substrates to coat the same and to provide a machine which includes apparatus for loading and unloading the substrates to and from the coating vacuum chamber in a manner to reduce the downtime between coating operations. A further aim is to provide the apparatus in a form and configuration which allows the size of the apparatus to be minimised and thereby allow the apparatus to be usable for relatively small batch sizes of substrates.

According to a first aspect of the invention there is provided apparatus for the deposition of material onto at least one substrate, said apparatus including a vacuum chamber, a vacuum creating means, at least one material deposition means, at least one reaction producing means, a means for introducing gas or gases into the chamber and a substrate carrier provided to be rotatable in the chamber and characterised in that the apparatus is provided with a loading chamber interconnected with the vacuum chamber such that at least one substrate is loaded onto the substrate carrier outside the vacuum chamber and the carrier and the at least one substrate thereon are then transferred into the vacuum chamber for coating.

In one embodiment the at least one substrate is loaded onto the carrier when the carrier is in the loading chamber in which a vacuum is then created and the carrier and at least one substrate thereon transferred from said loading chamber into the vacuum chamber whilst the vacuum is maintained in both chambers.

In an alternative embodiment the substrates are loaded onto the carrier at a location remote from the coating apparatus, loaded into the loading chamber and then in turn into the vacuum chamber.

The invention of loading the substrates onto the carrier and then transferring both the carrier and substrates into the vacuum chamber of the apparatus allows the substrates to be loaded relatively easily and allows the downtime of the coating apparatus to be considerably reduced. Furthermore the substrates can be loaded onto the carrier at a location remote from the coating apparatus thereby allowing the same to be loaded under optimum loading conditions and, if desired at a central loading point, from where the carriers with substrates thereon can be stored and then delivered to the coating apparatus when required.

Typically each coating apparatus is provided with a plurality of carriers such that when one carrier is in a position in the apparatus for coating another can be loaded with substrates thereby further reducing the downtime of the coating apparatus due to loading and unloading. This ability also allows smaller batch sizes of substrates to be coated hence allowing smaller apparatus to be provided without greatly affecting the volume of coated substrates produced.

In a further aspect of the invention there is provided a method of loading substrates into a vacuum chamber including at least one material deposition means, at least a first reaction producing means and a means for introducing gas or gases into the chamber for the application of a coating onto said substrates characterised by the steps of, loading the substrates onto a substrate carrier while the carrier is external of the sealed vacuum chamber, sealing the carrier and substrates thereon in a loading chamber interconnected with the vacuum chamber, creating a vacuum in the loading chamber, opening the vacuum chamber to the loading chamber and moving the carrier and substrates thereon into the vacuum chamber to a position for rotation therein and closing the vacuum chamber.

Thus the carrier and substrates are moved into the vacuum chamber and, in one embodiment, they are moved from a loading chamber positioned below the vacuum chamber by means of an automated lifting means which moves the carrier between chambers to load and unload the carrier to and from the vacuum chamber.

This method allows the carrier to be loaded away from the coating apparatus, ie at a central loading station or factory and delivered under optimum conditions as and when required. The method also allows the coating apparatus to be operational in coating one batch of substrates on one carrier while other substrates are being loaded onto another carrier such that once one batch has been coated the carrier and substrates can be removed from the apparatus and replaced quickly with a new carrier already loaded with substrates.

As the vacuum chamber is not exposed to air at atmospheric pressure and because it is under vacuum, the targets are not oxidised and do not require shutters or preconditioning.

In a yet further aspect of the present invention there is provided apparatus for the deposition of material onto a substrate comprising a vacuum chamber, a vacuum creating means, at least a first material deposition means, at least a first reaction producing means, a means for introducing gas or gases into the chamber, and a substrate carrier mounted for rotation in the vacuum chamber and characterised in that the substrate carrier and/or vacuum chamber walls are provided with a plurality of substantially linear protrusions such that during rotation of the carrier the protrusions minimise the conductance of gas through the chamber.

In one preferred embodiment the linear protrusions are provided on the substrate carrier and the substrates are mounted between adjacent protrusions.

Reference hereonin is made to vanes which should be understood to relate to substantially linear protrusions which protrude from the planes of the carrier on which the substrates are carried and these protrusions act as barriers to the transfer of gas around the chamber by limiting the conductance around the chamber.

Preferably the vanes do not contact the chamber walls but are sufficiently proximate such that as the substrate carrier rotates the conductance of the gas is minimised between respective zones and as the vanes have this effect there is no need for physical separation of deposition and reaction zones in the chamber and hence the apparatus in general can be provided in a much smaller scale than the conventional apparatus.

Typically the substrate carrier is substantially in the form of a cube and the vertical corners of the cube form the vanes. The vanes are preferably formed by or mounted on, the four vertical corners of the cube facing outwardly toward the chamber walls and additional parts can be fitted to the corners to further extend the protrusions, and hence the vanes, toward the wall of the chamber. Typically the width of the vanes can be up to 30 mm.

Typically the material deposition means are magnetrons and the said magnetrons are preferably mounted in a vertical plane on the chamber walls facing inwardly toward the substrate carrier.

Preferably the seals formed by the vanes prevent the easy flow of gases between the deposition magnetrons. Typically the vanes prevent the easy flow of gases between the material deposition region and the reaction producing means.

The vanes allow the physical separation required between the magnetrons and a plasma source, which can, in one embodiment be an unbalanced magnetron, to be significantly reduced and therefore the overall dimensions of the coating apparatus are significantly reduced.

Typically the reaction producing means is a plasma generated by an unbalanced magnetron. Use of the unbalanced magnetron in gases or mixtures of gases such as, for example, oxygen, nitrogen or hydrogen causes the release of activated gas which reacts with the deposited material to form a coating on the substrate such as for example metal oxides, nitrides and hydrides, or a carbon containing compound or mixtures are created as opposed to metal oxides to suit particular requirements.

The vanes, during rotation of the substrate carrier, prevent the easy flow of gas between the material deposition areas and the reaction area and thus the gases in the respective areas can be closely controlled to ensure that the optimum gas conditions are obtained to provide optimum material deposition and reaction environments to allow improved quality coatings to be achieved.

Typically the substrates which can be coated have a maximum thickness of up to 30 mm.

Preferably two material deposition magnetrons are provided, to be operated at different times to produce a multilayered coating on the substrates. Typically the magnetrons have targets of any suitable metal such as silicon, titanium, zirconium or niobium. The reaction zone is defined by providing an unbalanced magnetron to emit an oxygen plasma into the reaction zone through which the carrier passes. Typically the material deposition magnetrons are controlled and activated by a DC power supply to bring about ion vapour deposition and the unbalanced magnetron is also controlled and driven by DC supply.

The chamber within which the material deposition and reactions take place is typically provided with a means for providing a vacuum in said chamber during the deposition and reaction stages.

In one embodiment the substrates can be mounted on a magazine and loaded from the magazine onto the carrier which is held in the vacuum chamber and a vacuum is maintained in the vacuum chamber. Alternatively the substrates are loaded onto the carrier and the substrates and the carrier are loaded into the vacuum chamber as the vacuum is maintained therein.

Specific embodiments of the aspects of the invention are now described with reference to the accompanying drawings wherein.

Figure 1:
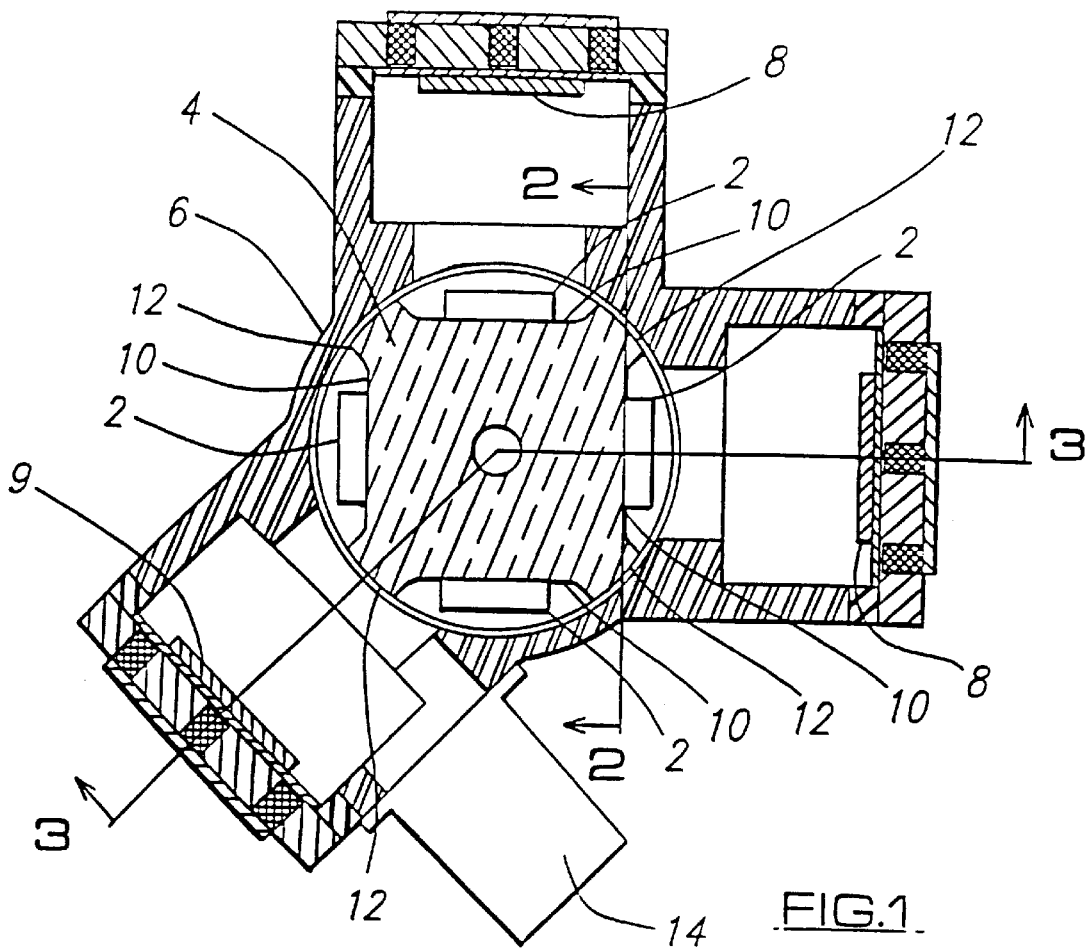
FIG. 1 illustrates a plan view of the apparatus of the invention with the top removed.

Referring firstly to FIG. 1 there is shown apparatus for the coating of a plurality of substrates 2. The substrates 2 are mounted on a substrate carrier 4 which in turn is mounted for rotation in a vacuum chamber 6. The chamber is provided with two magnetron assemblies 8 mounted on the side walls of the chamber and facing inwardly toward the substrate carrier 4 for the deposition of material onto the substrates 2. The material is deposited by the sputtering of material from a target of the desired material in the magnetron onto the substrates 2 to coat the same. In this embodiment a plasma source in the form of an unbalanced magnetron 9 is provided which, when activated and driven, produces an oxygen plasma into the chamber such that the plasma reacts with the deposited material to form an oxide coating on the substrates 2.

The substrate carrier 4 is, in this embodiment, substantially in the form of a cube and the substrates 2 are mounted on the four vertical faces 10 of the cube. The cube is also provided with four corner edges and these edges form the gas partitioning vanes 12. In order for the vanes 12 to be effective the substrate carrier 4 is mounted for rotation about its central vertical axis and the chamber 6 is constructed such that the vanes, as the carrier 4 rotates, pass in close proximation to the walls of the chamber 6 thus preventing the easy flow of gases between magnetrons.

The vacuum chamber 6 is also provided with a vacuum pump 14 connected thereto to cause the chamber to be under vacuum during use.

Figure 2:
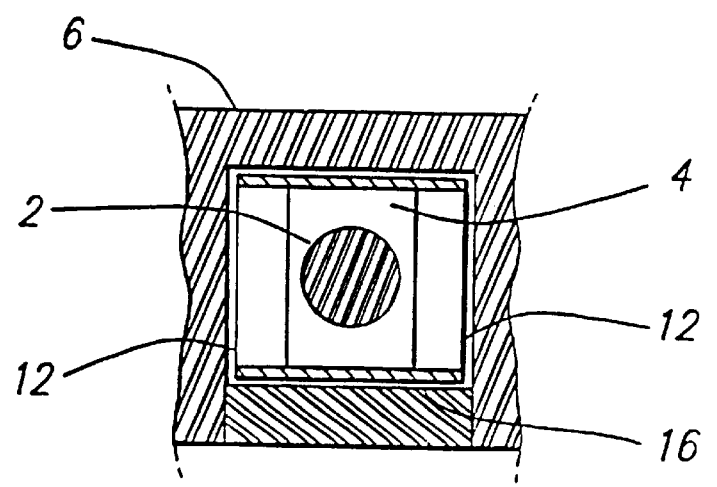
FIG. 2 illustrates a sectional elevation of the vacuum chamber through the line 2—2 of FIG. 1.

Referring now to FIG. 2 there is shown a sectional view into the vacuum chamber 6 on line 2—2 showing the substrate carrier 4 with a substrate 2 mounted thereon. The carrier 4 is mounted for rotation about the central axis 16 by a drive means (not shown) and as it does so the vanes 12 rotate in close proximity to the walls of the vacuum chamber 6.

Figure 3:
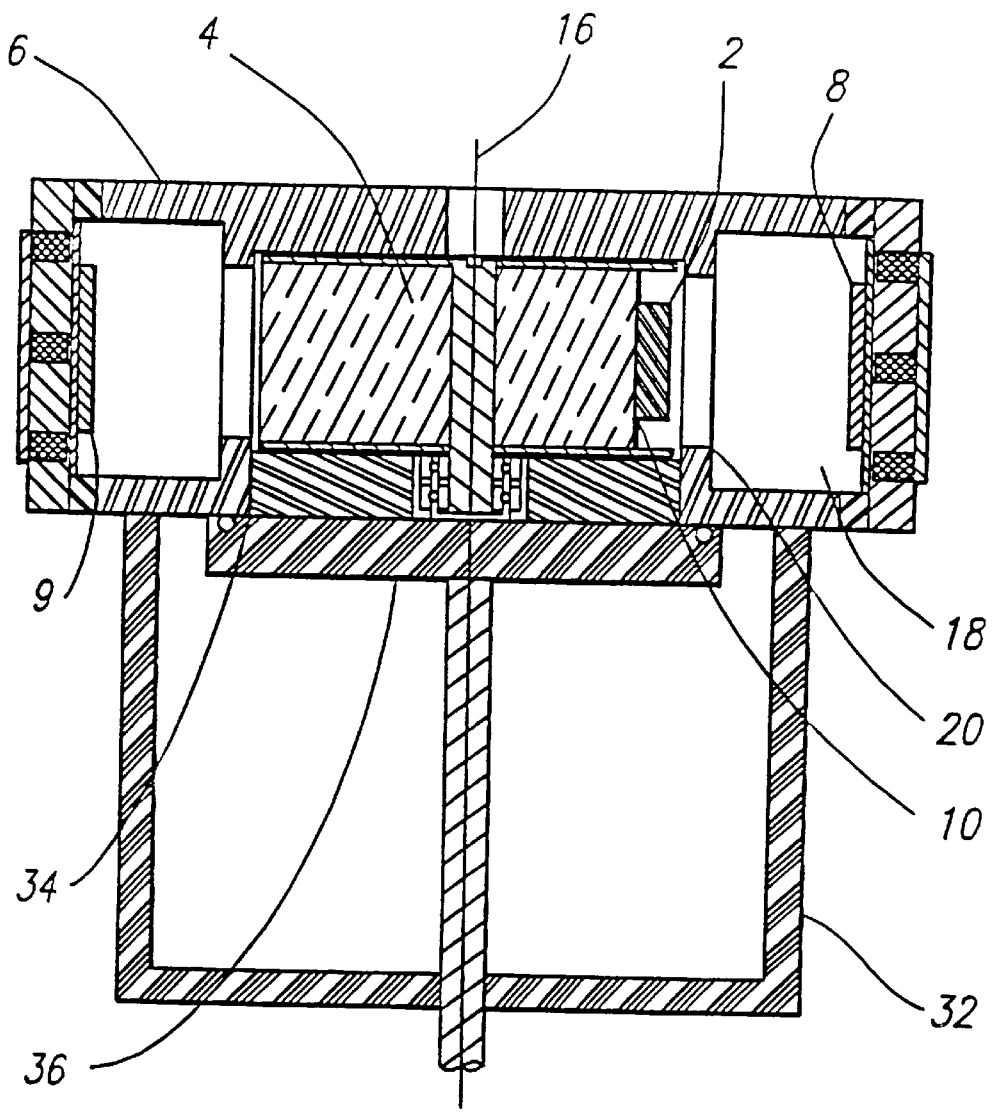
FIG. 3 illustrates a sectional elevation through the line 3—3 of FIG. 1.

FIG. 3 illustrates a sectional elevation through the apparatus and shows the carrier 4, the vacuum chamber 6 one of the material deposition magnetrons 8 and the unbalanced oxygen producing magnetron 9. The carrier 4 is shown carrying a substrate 2 on each of the flat sides 10 but it is possible that more than one substrate can be held on each of the sides 10 if required. The magnetron 8 is mounted in an area 18 adjacent the chamber 6 and the wall of the chamber is provided with an aperture 20 therein which allows the material sputtered from the magnetron to pass into the chamber 6 and onto the substrates 2 as they are rotated past the aperture 20. The magnetron comprises a target of suitable metal to produce the desired coating layer on the substrate and the aperture 20 determines the shape of emittance of sputtered material from the magnetron 8 into the chamber. The unbalanced magnetron 9, when activated, creates an oxygen plasma in at least the adjacent portion of the chamber 6 to cause the material deposited from the magnetrons 8 to form into an oxide layer on the substrate.

When more than one material deposition magnetron 8 is provided a multilayered coating is produced on the substrate by the activation of each of the magnetrons for separate periods of time to build up the layers of coating required.

The provision of the carrier 4 with vanes 12 in proximity to the walls of the chamber minimises the gas conductance through the chamber and hence the provision of the vanes 12 overcomes the need for physical separation means for the magnetrons such as shuttering or partitioning to be provided to prevent gas contamination between the reaction and deposition zones. The provision of the vanes 12 prevents the easy flow of gases such as argon and oxygen between the deposition and reaction zones respectively. The material deposition magnetrons operate most effectively in the presence of argon alone while the unbalanced magnetron operates most effectively in an argon and oxygen mixture or in pure oxygen. The penetration of significant amounts of oxygen into the deposition zone is to be avoided as this leads to unstable operation of the material deposition magnetrons 8. The vanes 12 prevent the leakage of oxygen from the reaction zone into the deposition zones while overcoming the need for large scale physical separation to be provided and thereby allowing the apparatus to be made on a smaller scale and meet the requirements of relatively small volume lens coating users.

In one example of using the apparatus described the magnetrons 8 are provided with Zirconium and Silicon targets respectively to provide an anti reflective coating on optical lens substrates with a multilayer of $ZrO_2$ and $SiO_2$. The deposition power of both the Zirconium and Silicon magnetrons is 1.2 KW with a target diameter of 100 mm and the Argon flow is 15 sccm. To form the oxide layer the unbalanced magnetron 9 is driven to produce $O_2$ at a flow of 15 sccm with an input power of 105 W.

With the parameters of flow and deposition set and controlled it is also important that the geometry of the respective components of the apparatus is correct and in this case the rate of rotation of the substrate carrier 4 is set at 100 rpm but can be up to 140 rpm and the pumping speed of the vacuum pump is 120 l/s and the base pressure is $5 \times 10^{-6}$ mBar. The distance of the optical lens substrates from the magnetron targets is also important to ensure that the maximum sputtering deposition is produced and in this case the distance of the lens from the target is 70 mm.

The above parameters allow the lens to be coated with an optical quality antireflective multilayered coat but, it should be noted that these parameters are for illustrative purposes and substantial variations in the same can be made. The apparatus illustrated in the embodiment is designed to be activated and driven by DC means such that the unbalanced and deposition magnetrons are operated by the switching on of the DC power supplies connected thereto.

Another important inventive aspect of the apparatus is the provision of the loading chamber 32 which is shown in FIG. 3 positioned below the vacuum chamber 6. The loading chamber 32 and vacuum chamber 6 are interconnected via an aperture 34 which is selectively openable by operation of a sealing plate 36. During the coating of the substrates in the vacuum chamber 6 the sealing plate 36 is maintained in a position sealing the aperture 34 as shown. To load and unload the substrates for coating, the substrates 2 are first loaded onto a substrate carrier 4 either when the carrier is positioned in the loading chamber or, alternatively, when the substrate carrier is completely removed from the apparatus. A vacuum is created in the empty vacuum chamber 6 with the sealing plate 36 in the sealing position shown. The carrier 4 and substrates 2 loaded thereon are then loaded into the loading chamber 32 and a door, (not shown) closed to seal the loading chamber 32. A vacuum is then created in the loading chamber and at the appropriate time the sealing plate 36 is moved to open the aperture 34. At this point the carrier 4 with substrates 2 loaded thereon is moved from the loading chamber 32, through the aperture 34 and into the vacuum chamber 6 and the sealing plate 36 is returned to the closed position to seal the carrier 4 and substrates 2 in the vacuum chamber 6 whereupon the coating operation as described previously can commence. The movement of the carrier between chambers is typically achieved by automated lifting means and the unloading of the carrier once coating of the substrates is completed follows the same steps as for loading but in reverse whereupon a vacuum is produced in the loading chamber 32, the sealing plate 36 is opened and the carrier 4 and substrates 2 are moved into the loading chamber. At this point, the sealing plate 36 is moved to isolate the vacuum chamber 6 from the loading chamber 32 upon which the carrier 4 and substrates 2 can be unloaded from the loading chamber 32 and, if required, immediately replaced with a loaded carrier 4 which can then be immediately loaded into the vacuum chamber 6 to allow the next batch of substrates 2 to be coated. It is therefore clear that the provision of the loading and unloading apparatus as described allows the downtime of the coating apparatus to be greatly reduced over the conventional load lock apparatus.

What is claimed is:

1. An apparatus for the deposition of material onto a plurality of substrates to form a coating thereon, said apparatus comprising:

a vacuum chamber, said vacuum chamber including a vacuum creating means, at least one material deposition means in the form of a magnetron having a target of a particular material to be sputtered onto the substrates, a reaction producing means for creating a reaction of the sputtered material, and a means for introducing gas or gases into the chamber;

a loading chamber linked to a vacuum creating means and provided with a port into the vacuum chamber which can be opened and closed and a port to the environment surrounding said apparatus which can be opened and closed; and a carrier, said carrier provided to carry the substrates thereon and driven to rotate in the vacuum chamber; and a plurality of protrusions in the form of vanes positioned on the substrate carrier so that during rotation of the carrier, the sputter deposition means and the reaction producing means are physically separated;

wherein the vacuum chamber is continuously held in a vacuum and, during loading of a batch of substrates to be coated, the carrier with substrates is held in the loading chamber at atmospheric pressure, a vacuum is created in the loading chamber, operation of one of the sputter devices and the reaction producing means is commenced, the port into the vacuum chamber is opened to allow the transfer of the carrier into the vacuum chamber, and during unloading, the carrier is removed from the vacuum chamber into the loading chamber in vacuum and unloaded in atmospheric pressure, whereupon the next batch is loaded and the apparatus operated for successive batches without time delay for cleaning or preconditioning of the sputter devices or reaction producing means intermediate each of the batches.

2. Apparatus according to claim 1 characterized in that the substrates are loaded onto the carrier when the carrier is in the loading chamber in which a vacuum is then created and the carrier and the substrate thereon transferred from said loading chamber into the vacuum chamber whilst a vacuum is maintained in both chambers.

3. Apparatus according to claim 1 characterized in that the substrates are loaded onto the carrier at a location remote from the coating apparatus, loaded into the loading chamber and then in turn into the vacuum chamber.

4. Apparatus according to claim 1 characterized in that the apparatus includes a plurality of carriers such that one carrier can be placed in the apparatus for coating of substrates thereon and at least one other can be loaded with substrates outside the vacuum chamber.

5. Apparatus according to claim 1 characterized in that the deposition means are magnetrons with targets of appropriate material.

6. Apparatus according to claim 5 characterized in that the magnetrons are mounted in a vertical plane on the chamber walls facing inwardly toward the substrate carrier.

7. Apparatus according to claim 1 characterized in that the reaction producing means is an oxygen plasma generated by an unbalanced magnetron.

8. Apparatus according to claim 7 characterized in that the reaction producing means can be operated in any gas or gas mixture to provide a coating of required properties.

9. Apparatus according to claim 1 characterized in that the substrates are coated to a maximum thickness of up to 30 mm.

10. Apparatus according to claim 1 characterized in that the substrates are loaded onto the carrier and the carrier and substrates thereon are loaded into the vacuum chamber for coating and the vacuum is maintained in the chamber.

11. An apparatus for the deposition of material onto a plurality of substrates comprising:

a vacuum chamber, a vacuum creating means, at least a first material deposition means in the form of a magnetron having a target of a particular material to be sputtered onto the substrates, at least a first reaction producing means for creating a reaction of the sputtered material, a means for introducing gas or gases into the chamber, a substrate carrier mounted for rotation in the vacuum chamber and having at least one vertical wall, each of said substrates mounted on the vertical wall of the carrier parallel with the axis of rotation of the carrier, and wherein there are provided at spaced intervals, a series of protrusions which extend outwardly from structures selected from the group consisting of:

the planes of the walls of the carrier on which the substrates are held, the walls of the chamber on which the material deposition means and reaction producing means are mounted, and the planes of the walls of the carrier and the walls of the chamber;

said protrusions extend towards the other of the chamber walls and carrier respectively so that during rotation of the carrier said sputter deposition means and said reaction producing means are physically separated.

12. Apparatus according to claim 11 characterized in that the protrusions are provided on the substrate carrier and the substrates are mounted between adjacent protrusions.

13. Apparatus according to claim 12 characterized in that the protrusions are in the form of vanes which protrude from the planes on which the substrates are carried.

14. Apparatus according to claim 13 characterized in that the vanes do not contact the chamber walls but are sufficiently proximate such that as the substrate carrier rotates the conductance of the gas around the chamber is minimised.

15. Apparatus according to claim 13 characterized in that the substrate carrier is substantially in the form of a cube and the vertical corners of the cube form the vanes.

16. Apparatus according to claim 15 characterized in that the vanes are formed by, or mounted on, the four vertical corners of the cube facing outwardly toward the chamber walls.

17. Apparatus according to claim 16 characterized in that additional parts can be fitted to the corners to further extend the corners and hence the vanes toward the wall of the chamber.

18. Apparatus according to claim 11 characterized in that the width of the protrusions can be up to 30 mm.

19. Apparatus according to claim 11 characterized in that the substrates are loaded onto the carrier while the carrier remains in a maintained vacuum.

* * * * *